United States Patent
Elshaer

(10) Patent No.: US 8,319,517 B2
(45) Date of Patent: Nov. 27, 2012

(54) GENERATOR TESTER

(75) Inventor: Anwar Salah Elshaer, Pembroke Pines, FL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 12/868,011

(22) Filed: Aug. 25, 2010

(65) Prior Publication Data

US 2012/0049886 A1 Mar. 1, 2012

(51) Int. Cl.
*G01R 31/34* (2006.01)

(52) U.S. Cl. .................................. 324/765.01

(58) Field of Classification Search .............. 324/765.01
See application file for complete search history.

(56) References Cited

U.S. PATENT DOCUMENTS

| | | | |
|---|---|---|---|
| 2,700,301 A | | 1/1955 | Thomsen |
| 4,658,213 A | * | 4/1987 | Finley ...................... 324/765.01 |
| 4,799,130 A | | 1/1989 | Emerson |
| 4,996,643 A | | 2/1991 | Sakamoto et al. |
| 5,241,277 A | | 8/1993 | Kefalas |
| 5,363,317 A | | 11/1994 | Rice et al. |
| 5,408,412 A | * | 4/1995 | Hogg et al. ...................... 701/33 |
| 5,557,216 A | * | 9/1996 | Dailey et al. .............. 324/750.16 |
| 5,583,440 A | * | 12/1996 | Bisher ............................ 324/426 |
| 5,928,022 A | | 7/1999 | Moeller |
| 5,949,247 A | * | 9/1999 | Lima et al. ................ 324/765.01 |
| 6,051,987 A | | 4/2000 | Stokes |
| 6,329,933 B1 | * | 12/2001 | Mikesic ......................... 340/946 |
| 6,651,441 B2 | * | 11/2003 | Reuter et al. ..................... 60/772 |
| 6,972,554 B1 | * | 12/2005 | Davis ......................... 324/121 R |
| 7,339,776 B1 | | 3/2008 | Hertel et al. |
| 7,376,876 B2 | * | 5/2008 | Raul et al. ...................... 714/738 |
| 2007/0229018 A1 | * | 10/2007 | Mitchell et al. ................ 318/650 |
| 2009/0039898 A1 | | 2/2009 | Raichle et al. |

FOREIGN PATENT DOCUMENTS

| | | |
|---|---|---|
| CN | 101685138 | 3/2010 |
| EP | 1693661 | 8/2006 |
| JP | 2-202161 | 8/1990 |

OTHER PUBLICATIONS

Extended European Search Report dated Oct. 26, 2011. EP App. No. 11178647.1-2216.
Singapore Search Report and Written Opinion, dated Mar. 15, 2012, Singapore Application No. 201105883-1.

* cited by examiner

*Primary Examiner* — Arleen M Vazquez
(74) *Attorney, Agent, or Firm* — Carlson, Gaskey & Olds PC

(57) ABSTRACT

An example generator test assembly includes a testing module operative to test a generator according to a test procedure. At least one connector is configured to couple the generator to the testing module. The generator has a generator identifier. The test module is configured to select the test procedure from a plurality of potential test procedures based on the generator identifier.

22 Claims, 4 Drawing Sheets

GENERATOR TESTER

BACKGROUND

This disclosure relates generally to testing a generator and, more particularly, to adjusting a test procedure for the generator based on an identifier associated with the generator.

Generators are well known. Many aircraft, for example, include generators that are used to produce electric power for various components. Turbomachines on the aircraft are often used to power the generator. Some aircraft use the generator as a motor during start-up to accelerate rotors of the turbomachine until the rotor is rotating fast enough to sustain operation of the turbomachine. Other aircraft only use a generator to provide power, such as an integrated drive generator (IDG). In both of these examples, the turbomachine drives the generator when the generator is providing power. The type and size of the generator depends on the components to be powered and other variables.

Technicians typically test a generator before installing the generator in the aircraft. After installation, the generator is periodically removed from the aircraft for other tests. As known, a component maintenance manual associated with the generator describes the required tests. The tests may evaluate the electrical integrity of the generator and identify potential problems. Testing the generator is labor intensive and time consuming.

SUMMARY

An example generator test assembly includes a testing module operative to test a generator according to a test procedure. At least one connector is configured to couple the generator to the testing module. The generator has a generator identifier. The test module is configured to select the test procedure from a plurality of potential test procedures based on the generator identifier.

Another example generator test assembly includes at least one connector and a testing module operative to test a generator according to a test procedure. The test module is configured to select the test procedure from a plurality of potential test procedures based on an identifier associated with the generator. The generator includes at least one connection interface that is used to electrically couple the generator to an aircraft when the generator is in an installed position and to electrically couple the generator to the testing module when the generator is in a testing position.

An example generator testing method includes connecting a test module to a generator and providing the test module with an identifier associated with the generator. The method uses the test module to select a test procedure based on the identifier and uses the test module to test the generator according to the test procedure.

These and other features of the disclosed examples can be best understood from the following specification and drawings, the following of which is a brief description.

DETAILED DESCRIPTION

Figure 1:
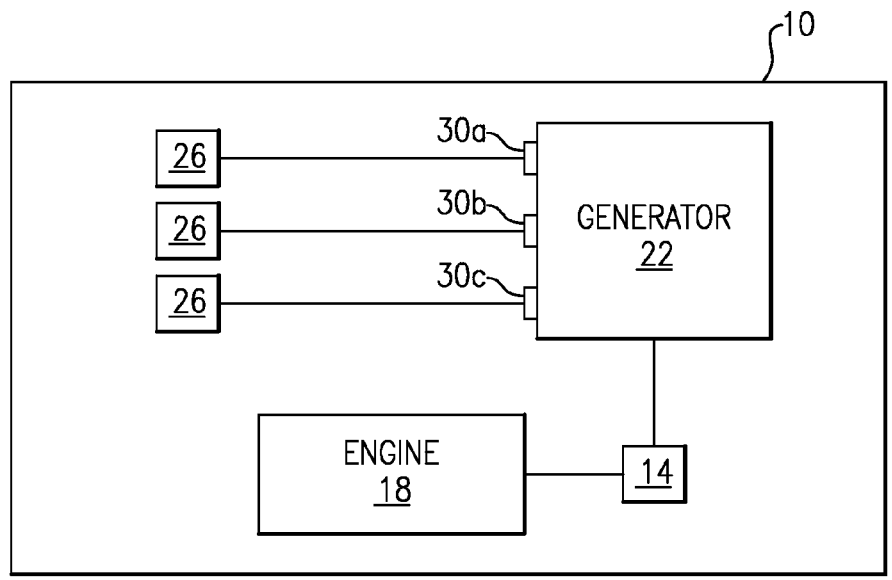
FIG. 1 shows a schematic view of a generator in an installed position within an aircraft.

Referring to FIG. 1, an example aircraft 10 includes a differential gear assembly 14 rotatably coupling a gas turbine engine 18 to a generator 22. The differential gear assembly 14 adjusts a rotational output from the gas turbine engine 18 so that the generator 22 is provided with a relatively consistent rotatable input, which allows the generator 22 to power a plurality of aircraft components 26. Examples of the aircraft components 26 include lights and sensors onboard the aircraft 10.

The generator 22 is an integrated drive generator in this example. The generator 22 includes a plurality of connection interfaces 30a-30c that electrically couple the components 26 to the generator 22. The connection interfaces 30a-30c are pin connectors in this example. The components 26 are decoupled from the connection interfaces 30a-30c when the generator 22 is removed from the aircraft 10. When the generator 22 is installed within the aircraft 10, the connection interfaces 30a-30c are used for communications between the generator 22 and a generator control unit in the aircraft 10, for example.

Figure 2:
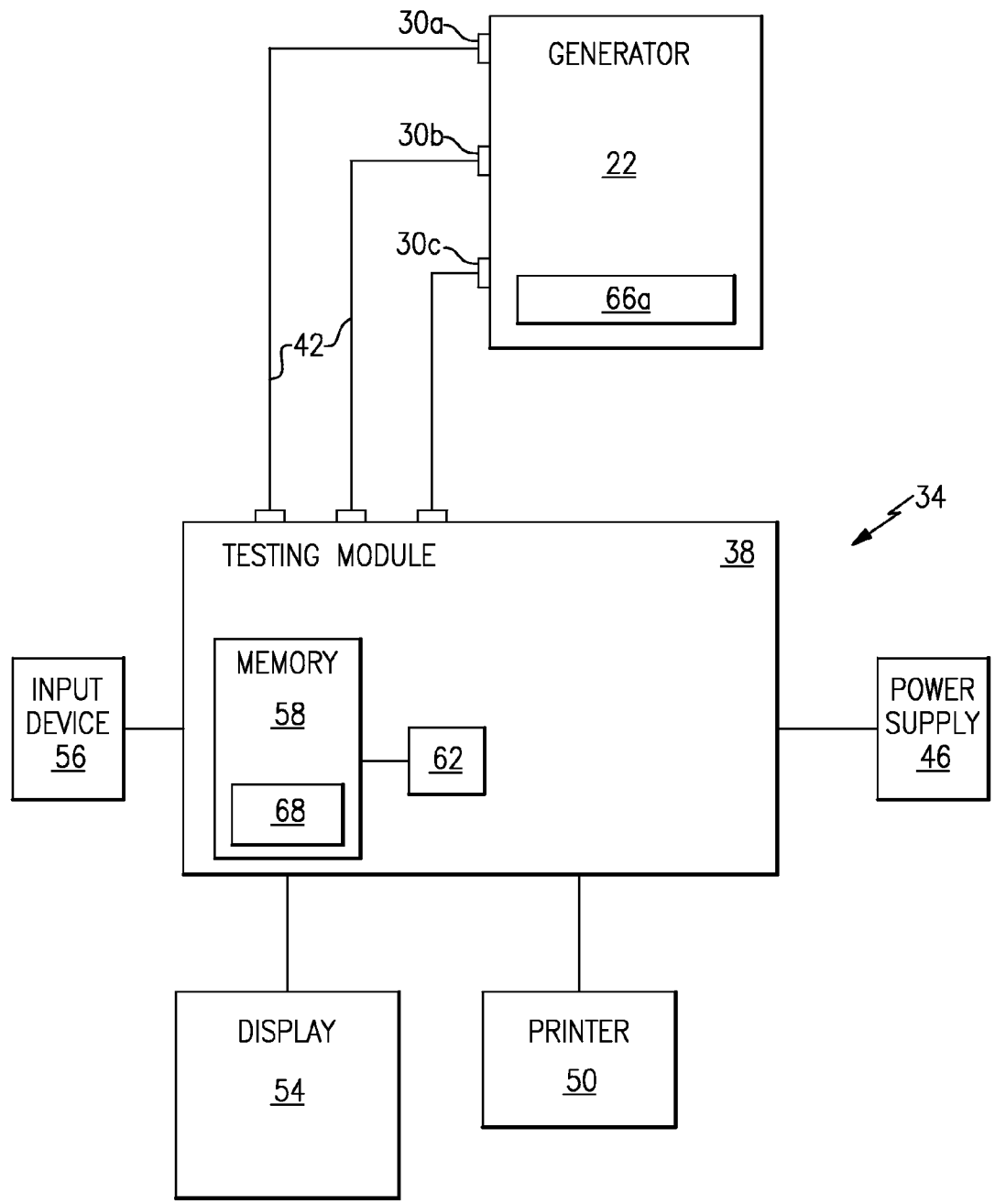
FIG. 2 shows a schematic view of the FIG. 1 generator in a testing position coupled to an example generator test assembly.

Referring now to FIG. 2 with continuing reference to FIG. 1, the generator 22 is periodically tested to determine the integrity of windings and coils within the generator 22, for example. The generator 22 is also tested prior to installing the generator 22 in the aircraft 10 for the first time. During testing, the generator 22 is removed from the aircraft 10 and placed in a testing position, such as a bench in a testing lab. Example tests performed on the generator 22 include dielectric tests, resistance tests, insulation tests, etc.

In this example, a generator test assembly 34 is used to test the generator 22. The generator test assembly 34 includes a testing module 38 that is coupled to the generator 22 using a plurality of connectors 42. In this example, each of the connectors 42 engages one of the connection interfaces 30a-30c. Notably, the connection interfaces 30a-30c are the same as the connection interfaces 30a-30c that electrically couple generator 22 to the components 26 when the generator 22 is in an installed position within the aircraft 10.

The testing module 38 is a type of computing device in this example. A power supply 46 provides power to the testing module 38. The example testing module 38 is linked to a printer 50 and a display 54, and includes a memory portion 58 and a processor 62.

It should be noted that various types of computing devices can be used as the testing module 38. In terms of hardware architecture, the computing device can include the processor 62, memory portion 58, and one or more input and/or output (I/O) device interface(s) that are communicatively coupled via a local interface. The local interface can include, for example but not limited to, one or more buses and/or other wired or wireless connections. The local interface may have additional elements, which are omitted for simplicity, such as controllers, buffers (caches), drivers, repeaters, and receivers to enable communications. Further, the local interface may include address, control, and/or data connections to enable appropriate communications among the aforementioned components.

The processor 62 may be a hardware device for executing software, particularly software stored in the memory portion 58. The processor 62 can be a custom made or commercially available processor, a central processing unit (CPU), an auxiliary processor among several processors associated with the computing device, a semiconductor based microprocessor (in the form of a microchip or chip set) or generally any device for executing software instructions.

The memory portion 58 can include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). Moreover, the memory portion 58 may incorporate electronic, magnetic, optical, and/or other types of storage media. Note that the memory portion 58 can also have a distributed architecture, where various components are situated remotely from one another, but can be accessed by the processor 62.

The software in the memory portion 58 may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory portion 58.

The Input/Output devices that may be coupled to system I/O Interface(s) may include input devices, for example but not limited to, a keyboard, mouse, scanner, microphone, camera, proximity device, etc. Further, the Input/Output devices may also include output devices, for example but not limited to, the printer 50, the display 54, etc. Finally, the Input/Output devices may further include devices that communicate both as inputs and outputs, for instance but not limited to, a modulator/demodulator (modem; for accessing another device, system, or network), a radio frequency ($\mu F$) or other transceiver, a telephonic interface, a bridge, a router, etc.

When the computing device is in operation, the processor 62 can be configured to execute software stored within the memory portion 58, to communicate data to and from the memory portion 58, and to generally control operations of the computing device pursuant to the software. Software in memory, in whole or in part, is read by the processor 62, perhaps buffered within the processor 62, and then executed.

Figure 3:
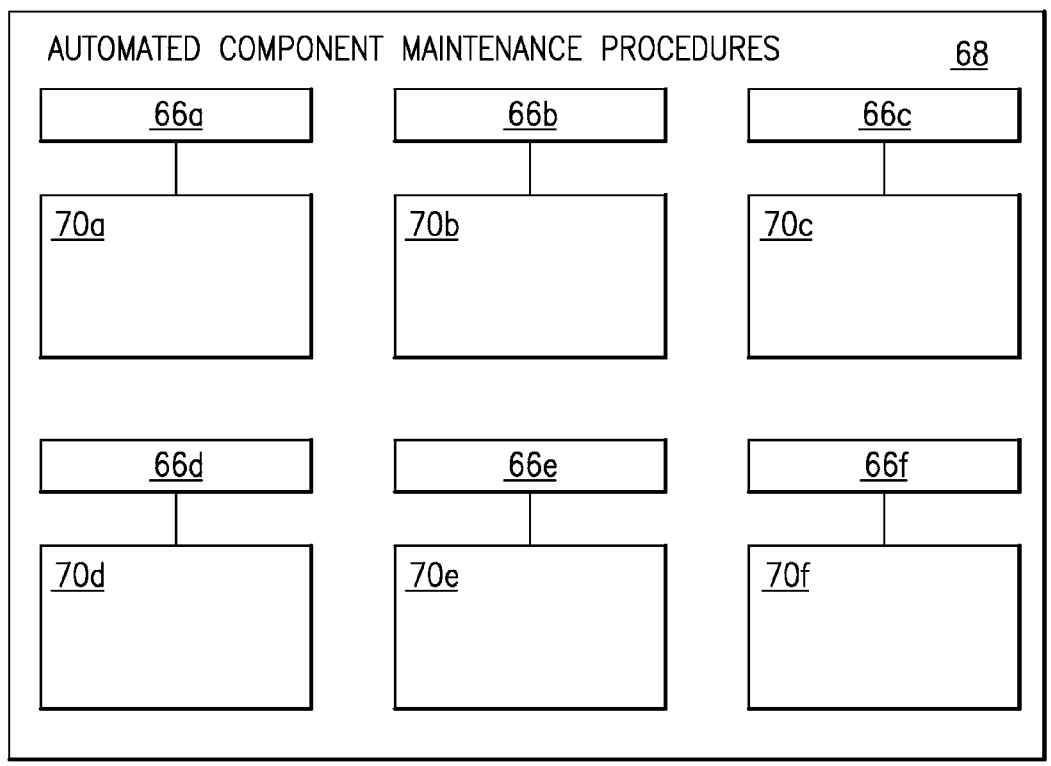
FIG. 3 shows a schematic view of a memory portion of the FIG. 2 generator test assembly.

Referring now to FIG. 3 with continuing reference to FIG. 2, the generator 22 has an associated generator identifier 66a. In this example, the generator identifier 66a is a generator part number. Although the generator part number is used as the generator identifier in this example, other examples may include other types of generator identifiers.

Other types of generators include other generator identifiers 66b-66f. As known, testing requirements for the generator 22 vary depending on the type of generator.

The example memory portion 58 of the testing module 38 stores a plurality of automated component maintenance procedures 68 that are derived from a component maintenance manual. The component maintenance procedures 68 include a plurality of test requirements 70a-70e. Each of the testing requirements 70a-70e is associated with one of the generator identifiers 66a-66f. The component maintenance procedures 68 include testing requirements 70a-70f for the generator 22 and various other types of generators.

When testing the generator 22, an operator inputs the generator identifier 66a into the testing module 38 using the input device 56. The processor 62 then selects the appropriate testing requirement from the component maintenance procedures 68 of the memory portion 58. The testing requirement 70a is the appropriate testing requirement in this example because the testing requirement 70a is associated with the generator identifier 66a.

After determining the testing requirement 70a, the testing module 38 performs tests on the generator 22 according to the testing requirements 70a. Example tests include dielectric tests, resistance tests, and insulation tests on the generator 22. Some of the tests require transmitting voltage to the generator 22 and then measuring relevant variables. Other tests, such as resistance tests, do not transmit voltage. In one specific test example, the resistance limit of a current transformer assembly within the generator 22 is tested. The current transformer assembly passes the test if the resistance limit of the current transformer assembly is 21.6 Ohms+/−2 Ohms.

Figure 4:
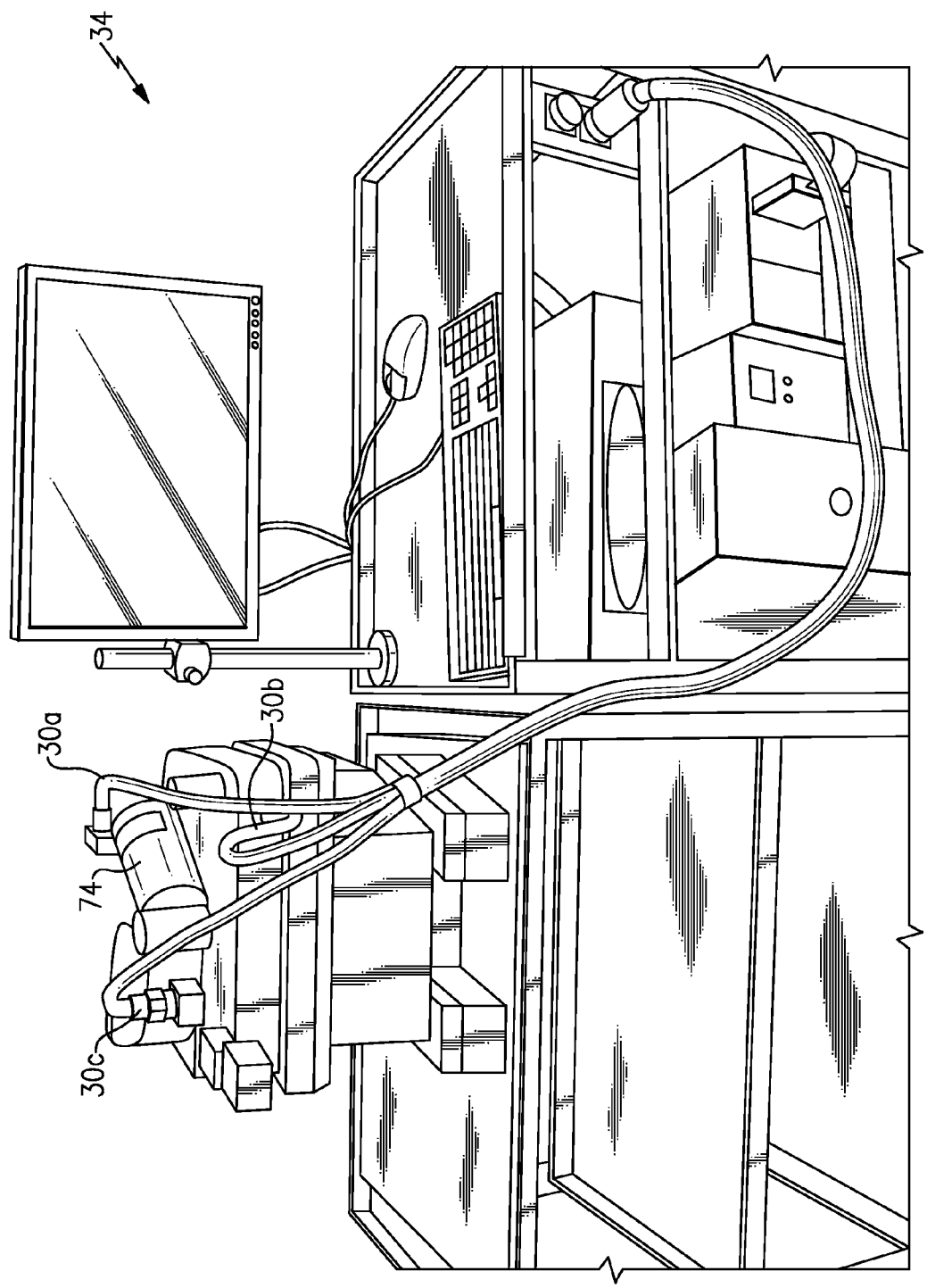
FIG. 4 shows a perspective view of the generator and generator test assembly of FIG. 2.

Referring to FIG. 4, the example generator test assembly 34 connects to another generator 74 at the connection interfaces 30a-30c. As the generator 74 has been removed from the aircraft 10 (FIG. 1), the connection interfaces 30a-30c are available for connection to the generator test assembly 34.

Figure 5:
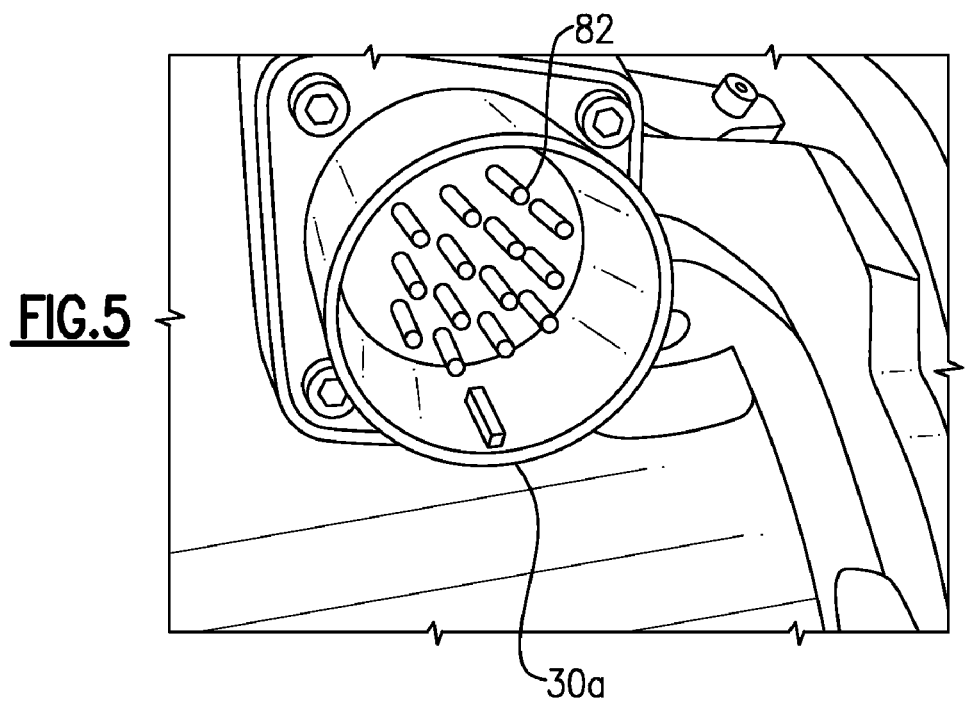
FIG. 5 shows a close-up view of a connection interface of the FIG. 4 generator.
Figure 6:
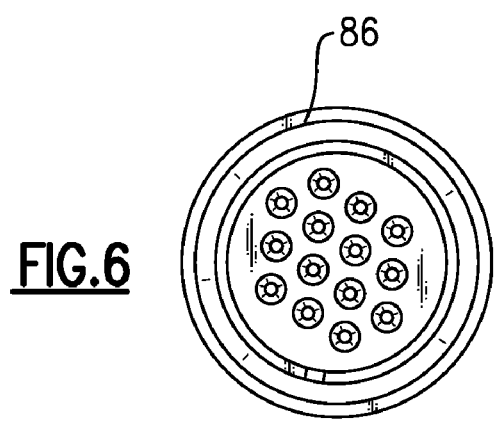
FIG. 6 shows an end view of a cannon plug from the FIG. 4 generator test assembly.

Referring now to FIGS. 5 and 6 with continuing reference to FIG. 4, the connection interfaces 30a-30c each include multiple individual pins 82 used to communicate power to and from the generator 74.

An end 86 of one or more of the connectors 42 is a cannon plug in this example. The cannon plug includes multiple apertures each configured to receive a respective pin from the connection interface 30a. The testing module 38 is able to communicate with each pin 82 within the connection interface 30a. The end 86 communicates voltage through selected ones of the pins 82 to test the generator 74. The specific voltage levels are dictated by the appropriate testing requirements 70a-70f.

Features of the disclosed example include automatically testing and determining testing requirements for a generator. That is, a technician is not required to test individual pins within the generator or to look up specific testing requirements within a component maintenance manual.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

I claim:

1. A generator test assembly comprising:
   a testing module operative to test a generator according to a test procedure; and
   at least one connector configured to couple the generator to the testing module,
   wherein the generator has a generator identifier and the testing module is configured to select the test procedure from a plurality of potential test procedures based on the generator identifier, wherein the generator is in an uninstalled position when coupled to the testing module.

2. The generator test assembly of claim 1, wherein the testing module communicates a voltage to the generator through the at least one connector.

3. The generator test assembly of claim 1, wherein the test comprises a dielectric test, a resistance test, an insulation test, or some combination of these.

4. The generator test assembly of claim 1, wherein the at least one connector comprises a cannon plug.

5. The generator test assembly of claim 1, wherein the generator identifier comprises a generator part number.

6. The generator test assembly of claim 1, wherein the generator is an integrated drive generator.

7. The generator test assembly of claim 1, wherein the generator in an installed position is configured to provide power to a plurality of aircraft components and is located a first distance from the generator, and all portions of the generator in the uninstalled position are located a second distance that is different from the first distance.

8. A generator test assembly, comprising:
at least one connector; and
a testing module operative to test a generator according to a test procedure, the testing module configured to select the test procedure from a plurality of potential test procedures based on an identifier associated with the generator,
wherein the generator includes at least one connection interface that electrically couples the generator to an aircraft when the generator is in an installed position and electrically couples the generator to the at least one connector of the testing module when the generator is in a testing position, wherein the plurality of potential test procedures comprise a dielectric test, a resistance test, an insulation test, or some combination of these.

9. The generator test assembly of claim 8, wherein the generator identifier comprises a generator part number.

10. The generator test assembly of claim 8, wherein the generator is an integrated drive generator.

11. A generator testing method, comprising:
receiving a generator that has been removed from an aircraft;
connecting a testing module to the generator;
providing the testing module with an identifier associated with the generator;
using the testing module to select a test procedure based on the identifier; and
using the testing module to test the generator according to the test procedure.

12. The generator testing method of claim 11, wherein the identifier comprises a part number of the generator.

13. The generator testing method of claim 11, wherein using the testing module to select the test procedure comprises automatically selecting the test procedure from a plurality of component maintenance procedures.

14. The generator testing method of claim 13, wherein the component maintenance procedures are electronically stored within a memory portion of the testing module.

15. The generator testing method of claim 11, wherein using the testing module to test the generator comprises dielectric testing, resistance testing, insulation testing, or some combination of these.

16. The generator testing method of claim 11, wherein the test procedure is selected from a group of potential test procedures.

17. The generator testing method of claim 11, wherein the generator is an integrated drive generator.

18. The generator testing method of claim 11, including connecting using a cannon plug.

19. The generator test assembly of claim 1, wherein the testing module is configured to automatically select the test procedure from a plurality of potential test procedures based on the generator identifier.

20. The generator test assembly of claim 8, wherein the testing module is configured to automatically select the test procedure from the plurality of potential test procedures based on the identifier associated with the generator.

21. The generator test assembly of claim 8, wherein the plurality of potential test procedures are predetermined.

22. The generator testing method of claim 13, wherein the plurality of component maintenance procedures are determined prior to the providing.

* * * * *